(12) United States Patent
Chua et al.

(10) Patent No.: US 8,278,959 B2
(45) Date of Patent: Oct. 2, 2012

(54) METHOD AND SYSTEM FOR MEASURING LASER INDUCED PHENOMENA CHANGES IN A SEMICONDUCTOR DEVICE

(75) Inventors: Choon Meng Chua, Singapore (SG); Lian Ser Koh, Singapore (SG); Soon Huat Tan, Singapore (SG); Wah Pheng Chua, Singapore (SG); Chee Hong Jacob Phang, Singapore (SG)

(73) Assignee: Semicaps Pte Ltd, Singapore (SG)

( * ) Notice: Subject to any disclaimer, the term of this patent is extended or adjusted under 35 U.S.C. 154(b) by 323 days.

(21) Appl. No.: 12/372,914

(22) Filed: Feb. 18, 2009

(65) Prior Publication Data

US 2010/0156451 A1 Jun. 24, 2010

Related U.S. Application Data

(63) Continuation-in-part of application No. 12/338,579, filed on Dec. 18, 2008, now abandoned.

(51) Int. Cl.
*G01R 31/02* (2006.01)
*G01R 31/302* (2006.01)

(52) U.S. Cl. .......... 324/762.01; 324/754.21; 324/762.09

(58) Field of Classification Search ............... 324/158.1, 324/750–753, 763–765, 754.21–754.25, 324/762.01–762.1
See application file for complete search history.

(56) References Cited

U.S. PATENT DOCUMENTS

| | | | | |
|---|---|---|---|---|
| 5,379,302 A * | 1/1995 | Andrews | ....................... | 714/727 |
| 5,438,268 A * | 8/1995 | Schleupen et al. | ............. | 324/399 |
| 5,982,190 A * | 11/1999 | Toro-Lira | ....................... | 324/770 |
| 6,069,523 A * | 5/2000 | Brown | ....................... | 327/563 |
| 6,249,178 B1 * | 6/2001 | Umeda | ....................... | 327/563 |
| 6,897,664 B1 * | 5/2005 | Bruce et al. | ................... | 324/751 |
| 6,954,168 B2 * | 10/2005 | Hoskins | ....................... | 341/155 |
| 7,084,648 B2 * | 8/2006 | Fitzgerald et al. | ............. | 324/713 |
| 7,149,343 B2 * | 12/2006 | Enachescu et al. | ............. | 382/149 |
| 7,453,032 B2 * | 11/2008 | Jepsen et al. | .................. | 800/323 |
| 7,623,982 B2 * | 11/2009 | Chua et al. | ..................... | 702/117 |
| 8,130,008 B2 * | 3/2012 | Kuenemund | ............. | 324/762.01 |
| 2003/0222220 A1 * | 12/2003 | Enachescu et al. | ......... | 250/341.6 |
| 2004/0008085 A1 * | 1/2004 | Khaw et al. | ................... | 330/260 |
| 2005/0134390 A1 * | 6/2005 | Glass | ............................ | 330/311 |
| 2008/0061883 A1 * | 3/2008 | Kataria | ....................... | 330/289 |

* cited by examiner

*Primary Examiner* — Joshua Benitez
(74) *Attorney, Agent, or Firm* — Harness, Dickey & Pierce, P.L.C.

(57) ABSTRACT

A method and system for measuring laser induced phenomena changes of at least one of a resistance, a capacitance and an inductance in a semiconductor device. The method comprises applying a biasing voltage from an emitter-follower circuit to a device under test (DUT); inducing said changes in the DUT; and measuring a voltage change in a collector portion of the emitter-follower circuit as a measure for said changes.

15 Claims, 6 Drawing Sheets

METHOD AND SYSTEM FOR MEASURING LASER INDUCED PHENOMENA CHANGES IN A SEMICONDUCTOR DEVICE

CROSS-REFERENCE TO RELATED APPLICATIONS

This application is a continuation-in-part Application of U.S. patent application Ser. No. 12/338,579 filed on Dec. 18, 2008. The entire disclosure of the above application is incorporated herein by reference.

FIELD OF INVENTION

The present invention relates broadly to a method and system for measuring laser induced phenomena changes of at least one of a resistance, a capacitance and an inductance in a semiconductor device.

BACKGROUND

Laser induced phenomena on semiconductor devices are used for example for failure analysis techniques for a variety of semiconductor devices. Examples of such failure analysis techniques include light induced voltage alteration (LIVA) techniques, thermally induced voltage alteration (TIVA) techniques, optical beam induced current (OBIC) techniques, and optical beam induced resistance change (OBIRCH) techniques.

Existing systems for implementing the above mentioned techniques have each been applied to failure analysis for particular purposes and conditions. However, existing systems do have certain limitations and disadvantages, which have hindered any one system from being suitable for a wide variety of analysis purposes and conditions.

For example, existing systems for TIVA and LIVA techniques use constant current biasing and an AC coupled amplifier. For an active device under test (DUT), due to voltage fluctuations such devices typically require a current surge during power-up, before reaching a stand-by state. The current surge can be several orders of magnitudes higher than the stand-by biasing current, and typical occurs over a very short period, for example in the order of µsec. Therefore, both TIVA and LIVA techniques, using constant current biasing, cannot provide the required current surge for proper power-up of an active DUT, and therefore existing TIVA and LIVA systems are typically limited to being applied to passive DUTs. In addition, using a constant current bias may lead to increase in DUT voltage during laser irradiation which may lead to DUT damage due to voltage over-stress.

As another example, existing OBIRCH systems, which are based on measuring changes in a current flow through the DUT, have been found to provide a lower sensitivity of the technique compared to TIVA and LIVA systems, for example. Furthermore, in OBIRCH systems, switching resistors in the measurement circuit to adjust sensitivity can effect a change of the DUT state as it changes the current that is being applied to the DUT.

As another example, a voltage bias and voltage change detection system uses an active reactive component in the measurement circuit. The use of the active reactive component may result in a back voltage which may cause damage to the measurement instrument or the DUT.

A need therefore exists for an alternative monitoring and measurement method and system for laser induced phenomena applications on semiconductor devices, which may address one or more of the above mentioned limitations and disadvantages.

SUMMARY

According to a first aspect of the present invention there is provided a method of measuring laser induced phenomena changes of at least one of a resistance, a capacitance and an inductance in a semiconductor device, the method comprising applying a biasing voltage from an emitter-follower circuit to a device under test (DUT); inducing said changes in the DUT; and measuring a voltage change in a collector portion of the emitter-follower circuit as a measure for said changes.

The method may further comprise changing a resistance value in the collector portion of the emitter follower circuit for changing a sensitivity of the measurement.

The method may further comprise providing a digital signal representative of the biasing voltage applied to the DUT to a microcontroller for display of a value of the actual biasing voltage to a user.

The method may further comprise providing a digital signal representative of a voltage in the collector portion of the emitter-follower circuit to the microcontroller for calculating a current flow in the collector portion of the emitter-follower circuit.

The method may further comprise the microcontroller determining whether a transistor of the emitter-follower circuit is in saturation based on the digital signal representative of the voltage in the collector portion of the emitter-follower circuit and the digital signal representative of the biasing voltage applied to the DUT.

According to a second aspect of the present invention there is provided a system for measuring laser induced phenomena changes of at least one of a resistance, a capacitance and an inductance in a semiconductor device; the system comprising an emitter-follower circuit for applying a biasing voltage to a device under test (DUT); and a laser source for inducing said changes in the DUT; and wherein the emitter-follower circuit comprises a measurement circuit for measuring a voltage change in a collector portion of the emitter-follower circuit as a measure for said changes.

The emitter-follower circuit may further comprise a switchable resistor network for changing a resistance value in the collector portion of the emitter follower circuit for changing a sensitivity of the system.

The system may further comprise a first analog to digital converter (ADC) coupled to the emitter-follower circuit for providing a digital signal representative of the biasing voltage applied to the DUT to a microcontroller of the system for display of a value of the actual biasing voltage to a user.

The system may further comprise a second ADC coupled to the emitter-follower circuit for providing a digital signal representative of a voltage in the collector portion of the emitter-follower circuit to the microcontroller for calculating a current flow in the collector portion of the emitter-follower circuit.

The microcontroller may determine whether a transistor of the emitter-follower circuit is in saturation based on the digital signal representative of the voltage in the collector portion of the emitter-follower circuit and the digital signal representative of the biasing voltage applied to the DUT.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
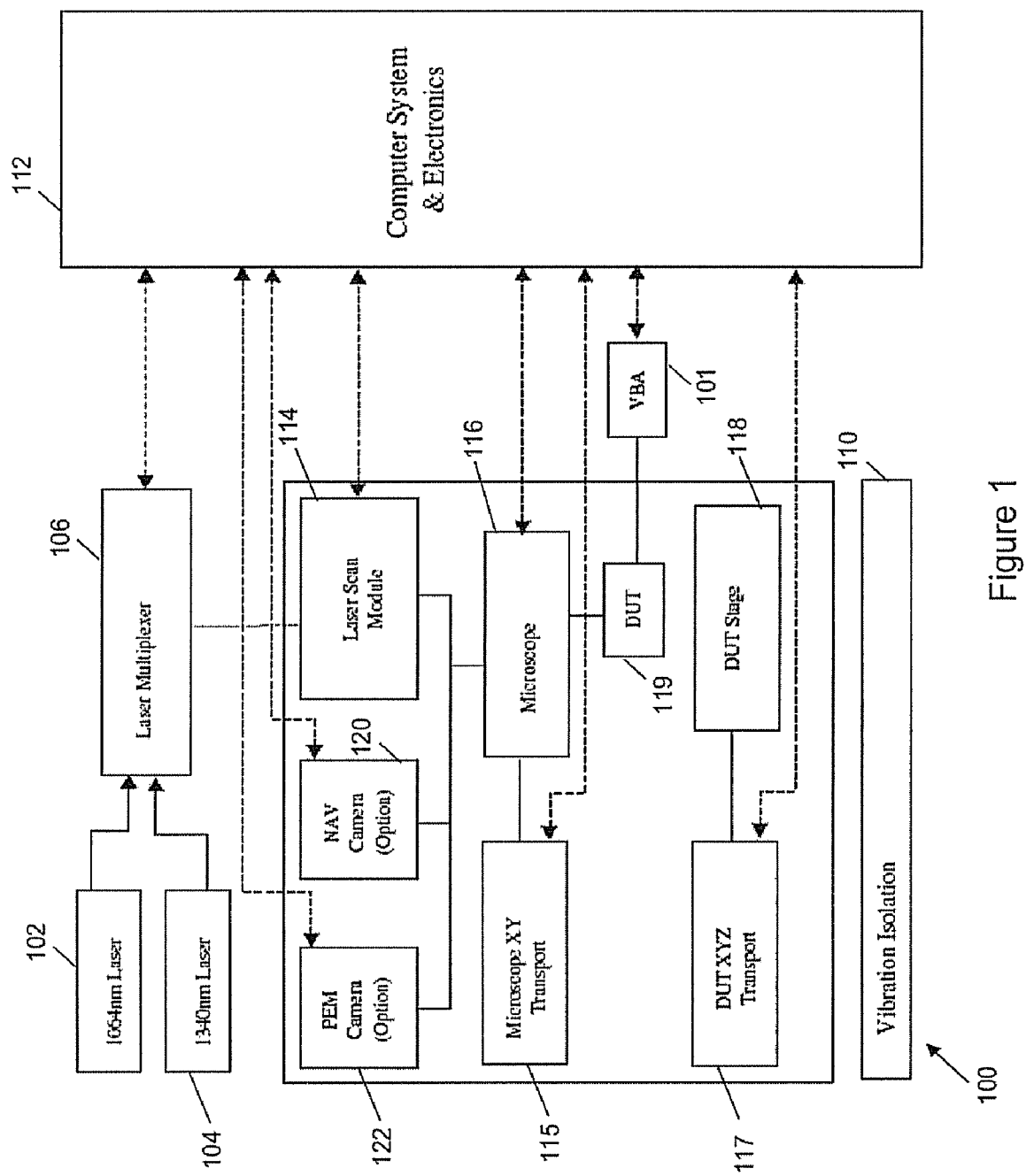
FIG. 1 shows a schematic diagram illustrating a scanning optical microscope system with a monitoring and measurement system according to an example embodiment of the present invention.

FIG. 1 shows a schematic diagram illustrating a scanning optical microscope system 100 with a monitoring and measurement system (101) according to an example embodiment of the present invention installed. The system 100 comprises a laser scan module 114 optically coupled to a microscope module 116. Two laser sources, a 1064 nm laser source 102 and a 1340 nm laser source 104, are optically coupled to the laser scan module 114 via a laser multiplexer 106.

Microscope XYZ transport 115 and DUT XYZ transport 117 are provided on a vibration isolation table 110, and mechanically coupled to the microscope module 116 and the DUT stage 118 respectively. The DUT (119) is mounted on the DUT stage 118. The computer system and electronics module 112 are coupled to the laser multiplexer 106, the laser scan module 114, microscope module 116 microscope XYZ transport (115) and DUT XYZ transport 117.

A TV-rate charge-coupled device (CCD) camera 120 and a photon emission microscope (PEM) camera 122 are mechanically coupled to the microscope module 116 and mounted on the vibration isolation table 110 in the example embodiment. The CCD camera 120 and PEM camera 122 are optically coupled to the microscope module 116 for capturing NAV and PEM images, respectively.

Figure 2:
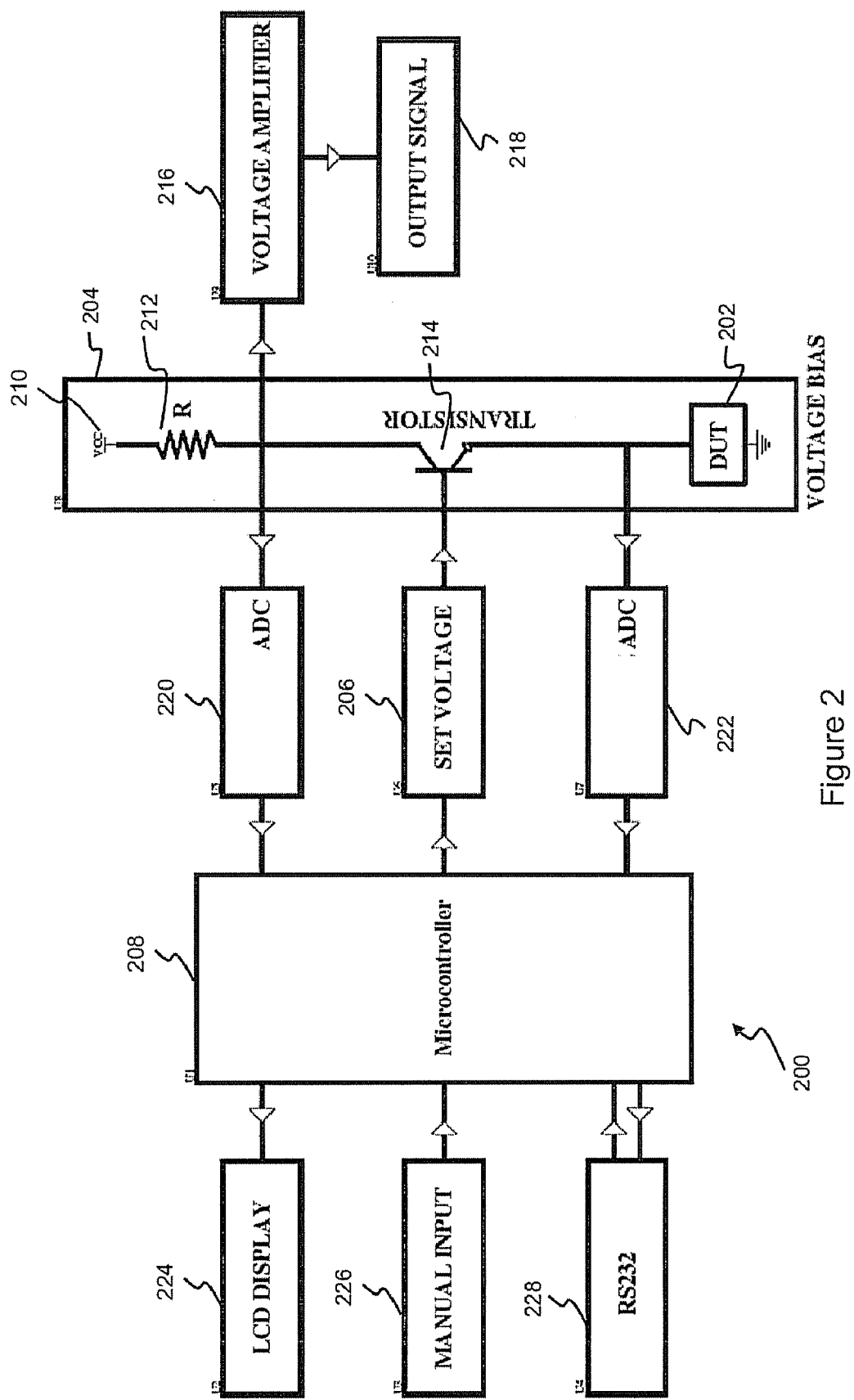
FIG. 2 shows a schematic circuit diagram of a monitoring and measurement circuit according to the example embodiment.

FIG. 2 shows a schematic circuit diagram of a monitoring and measurement circuit 200 as implemented in the monitoring and measurement system 100 (FIG. 1) in the example embodiment. The circuit 200 is utilised to measure changes in the resistance of a semiconductor DUT 202 by measuring collector voltage changes in an emitter-follower voltage bias circuit 204. The biasing voltage applied to the DUT 202 using the emitter follower voltage bias circuit 204 is set using a voltage setting circuit 206 under the control of a microcontroller 208. It will be appreciated by a person skilled in the art that the voltage bias of the DUT 202 is thus maintained constant according to the set voltage. The collector portion of the emitter-follower voltage bias circuit 204 acts as a current source from the $V_{CC}$ 210 connected to the emitter follower voltage biasing 204.

A liquid crystal display (LCD) display unit 224 is coupled to the microcontroller 208 for providing visual output from the monitoring and measurement circuit 200 to a user. A manual input unit 226 is also coupled to the microcontroller 208, as well as an RS 232 interface unit 228.

In operation, changes in e.g. the resistance of the DUT will result in changes in the current flow through the emitter follower voltage bias circuit 204, since the voltage bias of the DUT is maintained constant as described above. In-turn, the change in the current flow will result in a change in the voltage measured between the resistor 212 and the transistor 214, using a voltage amplifier circuit 216 for generating an output signal 218. The output signal 218 is thus a measure for the laser induced phenomena changes in the DUT 202.

The resistor schematically indicated at numeral 212 in FIG. 2 represents a switchable resistor network for implementing different resistance values in the collector portion of the emitter follower voltage biasing circuit 204, as will be described in more detail for an example implementation below. The monitoring and measurement circuit 200 advantageously allows make-before-break switching between different resistance values in the collector portion of the emitter follower voltage bias circuit 204 to change the sensitivity of the measurement without affecting the current flow through the DUT 202. Because the biasing voltage across the DUT 202 is maintained constant, the current flow through the DUT 202 only changes with changes induced in the DUT, thus the transistor 214 effectively isolates the DUT 202 from changes caused by switching between different resistances in the collector portion of the emitter follower voltage bias circuit 204.

In the monitoring and measurement circuit 200, an analog to digital (ADC) converter unit 220 is also connected to the collector portion of the emitter-follower voltage bias circuit 204, to provide a digital signal representative of the collector voltage. This collector voltage and the selected resistance are used by the microcontroller 208 to calculate the current flow in the collector portion of the emitter follower voltage bias circuit 204. The microcontroller 208 displays the current value via the LCD display 224. Another ADC converter unit 222 is connected at the emitter portion of the emitter follower voltage bias circuit 204 between the transistor 214 and the DUT 202, to provide a digital signal representative of the voltage across the DUT 202 to the microcontroller 208. The measured voltage across the DUT is also displayed on the LCD 224 and can be used as a confirmation to the user that the DUT voltage is correctly set.

The microcontroller 208 compares the collector voltage with the emitter voltage to determine whether the transistor 214 is saturated. The microcontroller 208 also displays a warning if transistor 214 is saturated on the LCD 224. Preferably, optimum sensitivity is obtained by selecting the resistance/current range that does not saturate the transistor 214.

Figure 3:
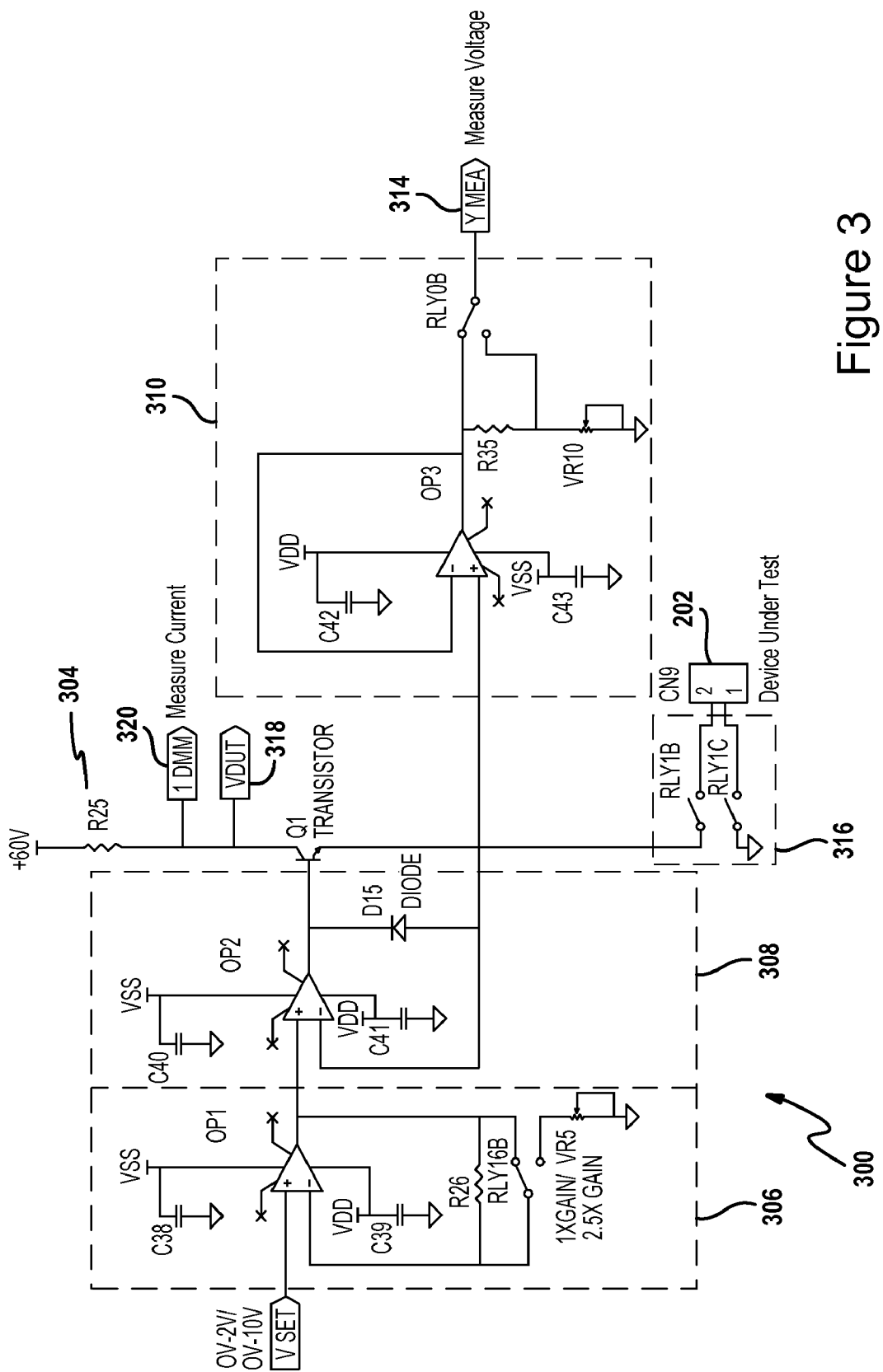
FIG. 3 shows a circuit diagram of a detail of the a monitoring and measurement circuit according to the example embodiment.

FIG. 3 shows a circuit diagram of an example implementation of the emitter-follower voltage bias circuit 300 (compare 204 in FIG. 2) in an example embodiment.

The emitter-follower voltage bias circuit 300 comprises a transistor 302 and a switchable resistor network, indicated for better clarity by resistor 304 in this diagram. The emitter-follower voltage biasing circuit 300 further comprises a voltage range selection circuit 306 connected to the $V_{in+}$ input of a non inverting gain amplifier circuit 308 for setting the transistor base voltage. The emitter-follower voltage bias circuit 300 also comprises an unity gain buffer and potential divider circuit 310 for scaling the actual voltage applied across the DUT 202 in the emitter portion of the emitter-follower voltage bias circuit 300, prior to providing the measured voltage signal 314 to the voltage ADC unit 222 (FIG. 2).

The voltage output from the voltage setting unit 206 (FIG. 2) is connected to the $V_{in+}$ input of the voltage range selection circuit 306, in which two voltage ranges can be set. A switch circuit 316 is provided for selectively connecting and disconnecting an interconnection to the DUT 202, for example for swapping between different DUTs.

The voltage measurement connection 318 in the collector portion of the emitter-follower voltage bias circuit 300 is provided to the voltage amplifier unit 216 (FIG. 2), and a current measurement connection 320 is provided to the current ADC unit 220 (FIG. 2).

During testing, a laser beam (not shown) for thermal simulation is rastered across the surface of the DUT 202 and changes in the resistance across the DUT 202 are induced due to temperature changes as a result of the thermal stimulation. The scanning of the laser is controlled by the computer system and electronics module 112 (FIG. 1), and a map of the resistance change across the DUT 202 can be obtained based on the measured output signal 218 (FIG. 2).

As will be appreciated by a person skilled in the art, while the laser beam is rastered across the surface of the DUT 202, the generated heat is dissipated from the point of incidence of the laser beam on the DUT 202. The heat dissipation is affected by a number of parameters or properties of the DUT 202, including e.g. the presence of defects such as voids. Therefore, the resulting temperature increases at different points of incidence of the laser beam produces different changes in the resistance across the DUT 202. The resulting map of the resistance changes as a function of the position of the point of incidence of the laser beam on the DUT 202 can be used to e.g. obtain a map indicative of location of defects such as voids in the DUT 202.

Furthermore, while in the embodiment described above with reference to FIG. 3 the resistance changes are described as being thermally induced, it will be appreciated by the person skilled in the art that embodiments of the present invention are equally suitable for monitoring and measuring resistance changes in a DUT as a result of different laser-induced phenomena, including, but not limited to, electron-hole pair stimulation. Furthermore, it will be appreciated by the person skilled in the art that embodiments of the present invention are equally suitable for ion- and electron-beam stimulation monitoring and measuring.

In the example embodiment, the collector voltage change is being measured. The change is typically small relative to the steady state voltage. The collector voltage is ac coupled via 318 to the voltage amplifier unit 216 (FIG. 2). The measured output signal 218 (FIG. 2) is ac, and the resulting map from a raster scan of the DUT 202 is an ac map of the small voltage fluctuations. The collector voltage is also dc coupled via 320 to the ADC 220 (FIG. 2) whose digitised output is used by the microcontroller unit 208 to calculate the current through the DUT and to display on the LCD as an indicator of the DUT bias condition.

Figure 4:
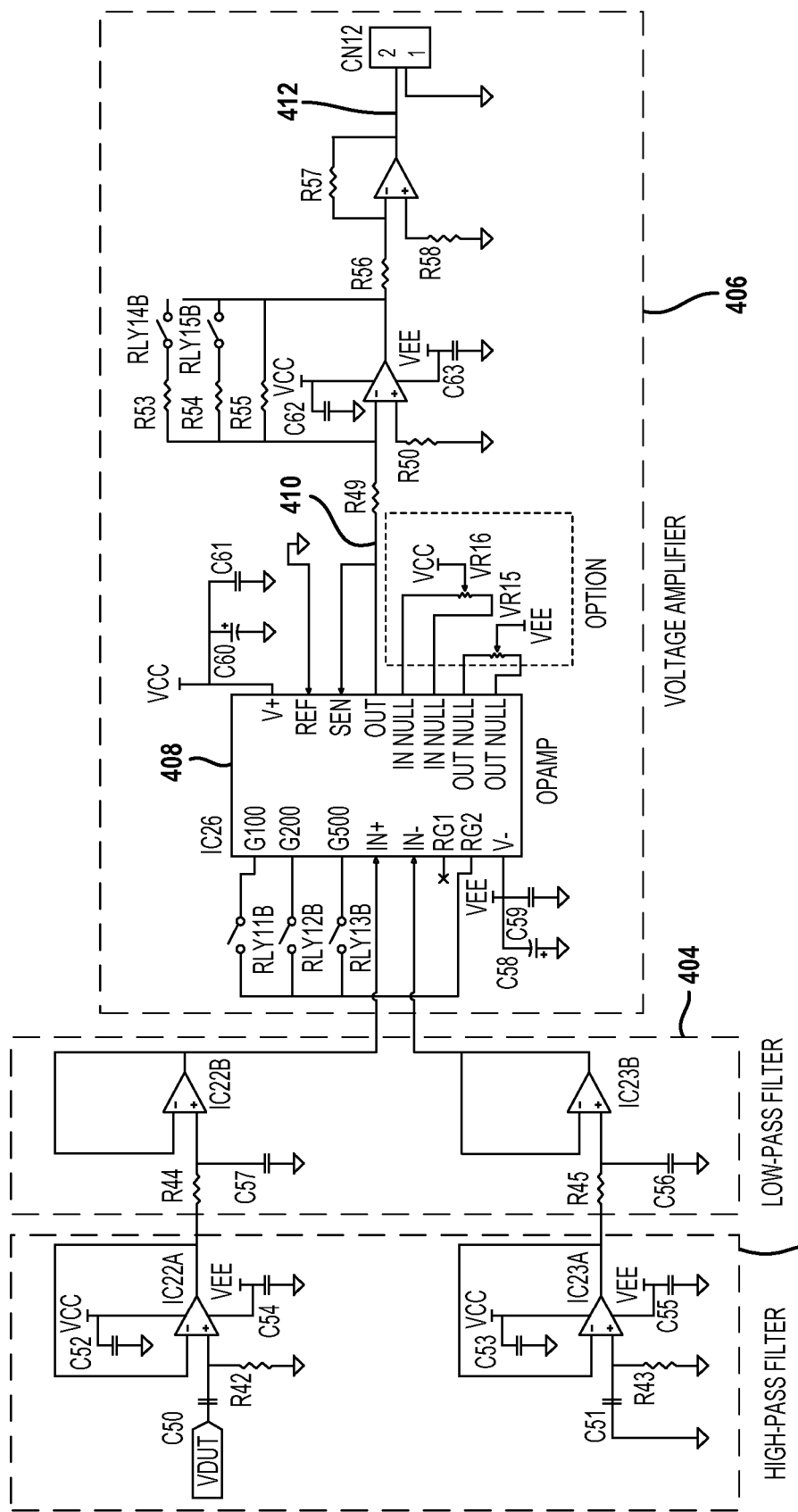
FIG. 4 shows a circuit diagram of a detail of the a monitoring and measurement circuit according to the example embodiment.

FIG. 4 shows a circuit diagram of an example implementation of the voltage amplifier unit 216 (FIG. 2), including a high pass filter circuit 402, a low pass filter circuit 404, and a voltage amplifier circuit 406. The low pass filter circuit 404 removes the mains coupled 50 Hz/60 Hz noise from the collector voltage (manifested as bands on the signal (resistance) map. The high pass filter circuit 402 removes high frequency noise (manifested as small dots/salt and pepper noise on the signal (resistance) map). IC26 at numeral 408 is a precision instrumentation amplifier with pin programmable gain. The output signal from IC26 at numeral 410 is further amplified to provide more gain steps than can be obtained by IC26. The voltage measurement output at numeral 412 is output to the computer system & electronics module 112 (FIG. 1) to generate the signal (resistance) map.

Figure 5:
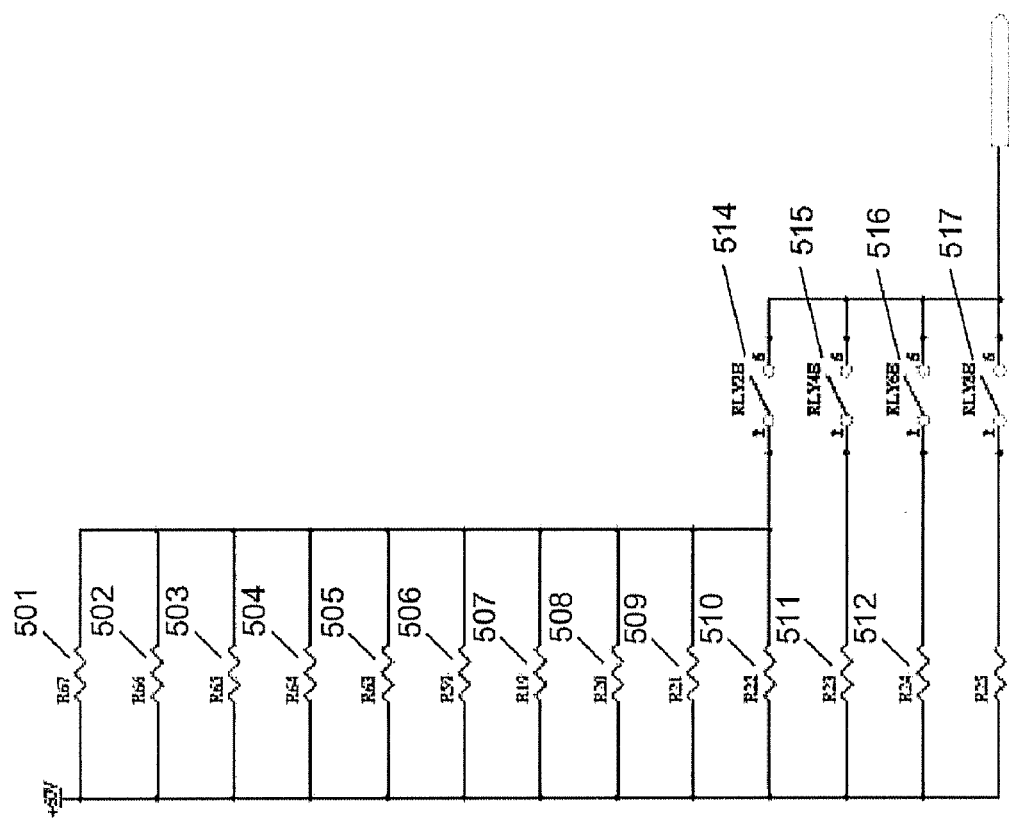
FIG. 5 shows a circuit diagram of a detail of the a monitoring and measurement circuit according to the example embodiment.

FIG. 5 shows a circuit diagram of an example implementation of the switchable resistor network schematically indicated at 212 at FIG. 2. The example implementation of the switchable resistor network 500 shown in FIG. 5 includes a rank of resistors 501 to 513, and switches 514 to 517. It will be appreciated by a person skilled in the art that different resistance values can thus be selected based on the state of the switches 514 to 517. In the example implementation, switches 514 to 517 are controlled by the microcontroller 208 (FIG. 2) in response to either manual input received through the manual input unit 228 (FIG. 2) and/or through control signals received via the RS 232 interface unit 228 (FIG. 2). A make before break switching method prevents disturbance to the DUT bias voltage (emitter voltage) when switching resistor values (current range) in the example embodiment.

Figure 6:
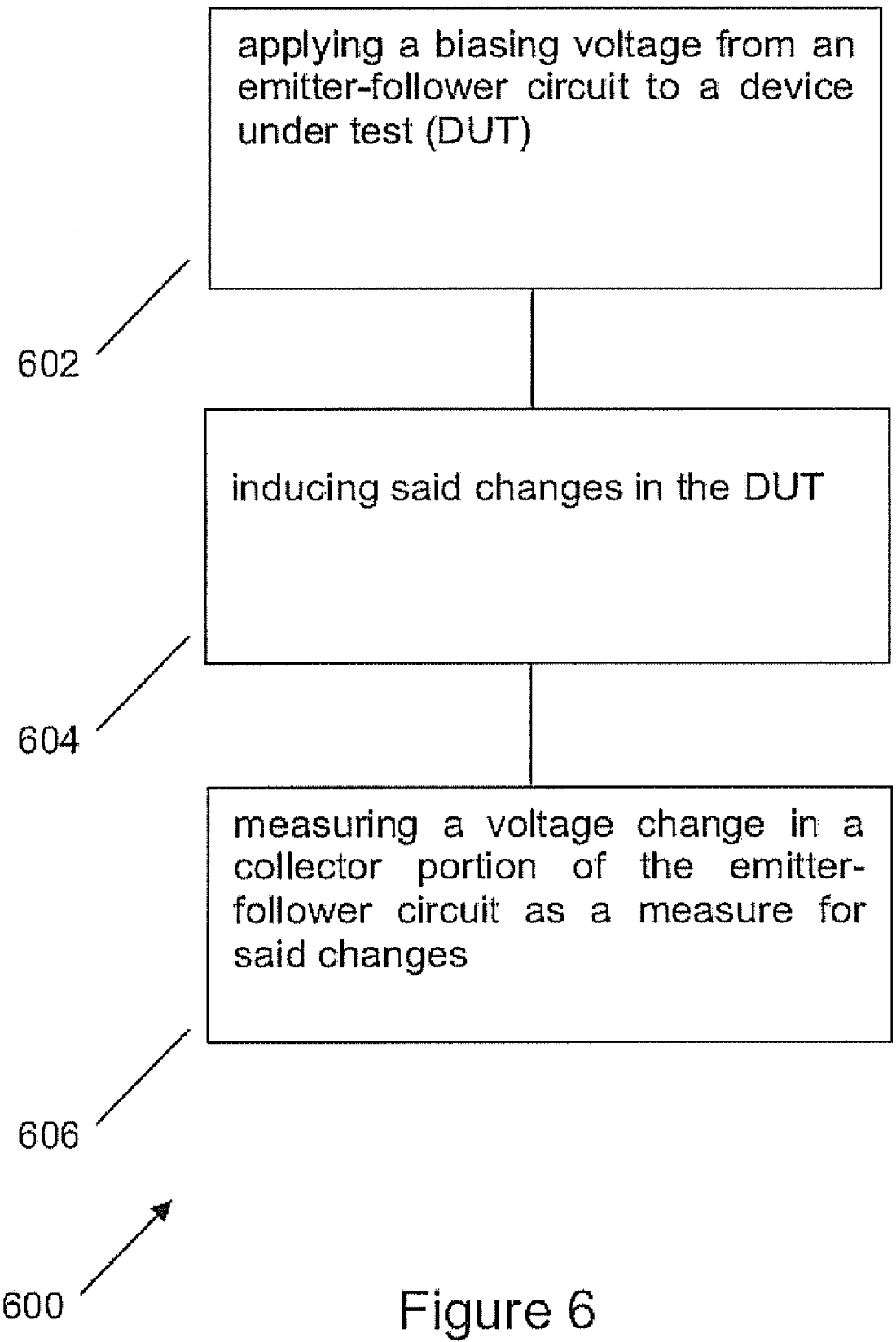
FIG. 6 shows a flowchart illustrating a method of measuring laser induced phenomena changes of at least one of a resistance, a capacitance and an inductance in a semiconductor device, according to an example embodiment.

FIG. 6 shows a flowchart illustrating a method 600 of measuring laser induced phenomena changes of at least one of a resistance, a capacitance and an inductance in a semiconductor device, according to an example embodiment. At step 602, a biasing voltage from an emitter-follower circuit is applied to a device under test (DUT). At step 604, said changes are induced in the DUT. At step 606, a voltage change in a collector portion of the emitter-follower circuit is measured as a measure for said changes.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of measuring laser induced phenomena changes of at least one of a resistance, a capacitance and an inductance in a semiconductor device, the method comprising:
    applying a biasing voltage from an emitter-follower circuit to a device under test (DUT);
    inducing said changes in the DUT;
    measuring a voltage change in a collector portion of the emitter-follower circuit as a measure for said changes; and
    providing a digital signal representative of the biasing voltage applied to the DUT to a microcontroller for display of a value of the actual biasing voltage to a user.

2. The method as claimed in claim 1, further comprising changing a resistance value in the collector portion of the emitter-follower circuit for changing a sensitivity of the measurement.

3. The method as claimed in claim 1, further comprising providing a digital signal representative of a voltage in the collector portion of the emitter-follower circuit to the microcontroller for calculating a current flow in the collector portion of the emitter-follower circuit.

4. The method as claimed in claim 3, further comprising the microcontroller determining whether a transistor of the emitter-follower circuit is in saturation based on the digital signal representative of the voltage in the collector portion of the emitter-follower circuit and the digital signal representative of the biasing voltage applied to the DUT.

5. A system for measuring laser induced phenomena changes of at least one of a resistance, a capacitance and an inductance in a semiconductor device; the system comprising:
    an emitter-follower circuit for applying a biasing voltage to a device under test (DUT);
    a laser source for inducing said changes in the DUT;

wherein the emitter-follower circuit comprises a measurement circuit for measuring a voltage change in a collector portion of the emitter-follower circuit as a measure for said changes; and a first analog to digital converter (ADC) coupled to the emitter-follower circuit for providing a digital signal representative of the biasing voltage applied to the DUT to a microcontroller of the system for display of a value of the actual biasing voltage to a user.

6. The system as claimed in claim 5, wherein the emitter-follower circuit further comprises a switchable resistor network for changing a resistance value in the collector portion of the emitter-follower circuit for changing a sensitivity of the system.

7. The system as claimed in claim 5, further comprising a second ADC coupled to the emitter-follower circuit for providing a digital signal representative of a voltage in the collector portion of the emitter-follower circuit to the microcontroller for calculating a current flow in the collector portion of the emitter-follower circuit.

8. The system as claimed in claim 7, wherein the microcontroller determines whether a transistor of the emitter-follower circuit is in saturation based on the digital signal representative of the voltage in the collector portion of the emitter-follower circuit and the digital signal representative of the biasing voltage applied to the DUT.

9. A method of measuring laser induced phenomena changes of at least one of a resistance, a capacitance and an inductance in a semiconductor device, the method comprising:

applying a biasing voltage from an emitter-follower circuit to a device under test (DUT);

inducing said changes in the DUT;

measuring a voltage change in a collector portion of the emitter-follower circuit as a measure for said changes; and providing a digital signal representative of a voltage in the collector portion of the emitter-follower circuit to a microcontroller for calculating a current flow in the collector portion of the emitter-follower circuit.

10. The method as claimed in claim 9, further comprising changing a resistance value in the collector portion of the emitter follower circuit for changing a sensitivity of the measurement.

11. The method as claimed in claim 9, further comprising providing a digital signal representative of the biasing voltage applied to the DUT to a microcontroller for display of a value of the actual biasing voltage to a user.

12. The method as claimed in claim 11, further comprising the microcontroller determining whether a transistor of the emitter-follower circuit is in saturation based on the digital signal representative of the voltage in the collector portion of the emitter-follower circuit and the digital signal representative of the biasing voltage applied to the DUT.

13. A system for measuring laser induced phenomena changes of at least one of a resistance, a capacitance and an inductance in a semiconductor device, the system comprising:

an emitter-follower circuit for applying a biasing voltage to a device under test (DUT); and a laser source for inducing said changes in the DUT;

wherein the emitter-follower circuit comprises a measurement circuit for measuring a voltage change in a collector portion of the emitter-follower circuit as a measure for said changes; and an analog to digital converter (ADC) coupled to the emitter-follower circuit for providing a digital signal representative of a voltage in the collector portion of the emitter-follower circuit to a microcontroller for calculating a current flow in the collector portion of the emitter-follower circuit.

14. The system as claim in claim 13, wherein the emitter-follower circuit further comprises a switchable resistor network for changing a resistance value in the collector portion of the emitter follower circuit for changing a sensitivity of the system.

15. The system as claimed in claim 13, wherein the microcontroller determines whether a transistor of the emitter-follower circuit is in saturation based on the digital signal representative of the voltage in the collector portion of the emitter-follower circuit and the digital signal representative of the biasing voltage applied to the DUT.

* * * * *